(12) United States Patent
Roberts et al.

(10) Patent No.: US 7,959,325 B2
(45) Date of Patent: Jun. 14, 2011

(54) SOLID STATE LIGHTING UNITS AND METHODS OF FORMING SOLID STATE LIGHTING UNITS

(75) Inventors: John K. Roberts, Grand Rapids, MI (US); Paul E. Sims, Pittsboro, NC (US); Chenhua You, Cary, NC (US)

(73) Assignee: Cree, Inc., Durham, NC (US)

( * ) Notice: Subject to any disclaimer, the term of this patent is extended or adjusted under 35 U.S.C. 154(b) by 1224 days.

(21) Appl. No.: 11/601,500

(22) Filed: Nov. 17, 2006

(65) Prior Publication Data

US 2007/0115671 A1    May 24, 2007

Related U.S. Application Data

(60) Provisional application No. 60/749,133, filed on Dec. 9, 2005, provisional application No. 60/738,305, filed on Nov. 18, 2005.

(51) Int. Cl.
  *F21V 29/00* (2006.01)
(52) U.S. Cl. ............... 362/249.02; 362/240; 362/245
(58) Field of Classification Search ............ 362/249.02, 362/249.06, 240, 367, 245, 246
  See application file for complete search history.

(56) References Cited

U.S. PATENT DOCUMENTS

| | | | |
|---|---|---|---|
| 4,329,625 A | 5/1982 | Nishizawa et al. | |
| 5,660,461 A * | 8/1997 | Ignatius et al. | 362/241 |
| 5,783,909 A | 7/1998 | Hochstein | |
| 5,889,568 A * | 3/1999 | Seraphim et al. | 349/73 |
| 5,959,316 A | 9/1999 | Lowery | |
| 6,078,148 A | 6/2000 | Hochstein | |
| 6,127,784 A | 10/2000 | Grossman et al. | |
| 6,153,985 A | 11/2000 | Grossman | |
| 6,236,331 B1 | 5/2001 | Dussureault | |
| 6,285,139 B1 | 9/2001 | Ghanem | |
| 6,350,041 B1 | 2/2002 | Tarsa et al. | |
| 6,362,578 B1 | 3/2002 | Swanson et al. | |
| 6,411,046 B1 | 6/2002 | Muthu | |
| 6,441,558 B1 | 8/2002 | Muthu et al. | |
| 6,495,964 B1 | 12/2002 | Muthu et al. | |
| 6,498,440 B2 | 12/2002 | Stam et al. | |
| 6,510,995 B2 | 1/2003 | Muthu et al. | |
| 6,576,881 B2 | 6/2003 | Muthu et al. | |

(Continued)

FOREIGN PATENT DOCUMENTS

EP    1 583 147 A2    10/2005

(Continued)

OTHER PUBLICATIONS

U.S. Appl. No. 11/755,149, filed May 30, 2007, Van De Ven.

(Continued)

*Primary Examiner* — Ali Alavi
(74) *Attorney, Agent, or Firm* — Myers Bigel Sibley & Sajovec

(57) ABSTRACT

A solid state lighting unit includes a plurality of solid state lighting tiles including a planar surface and a plurality of solid state light sources on the planar surface. The lighting unit includes a plurality of bar support members. Respective ones of the bar support members include at least two of the plurality of tiles affixed thereon to form respective bar assemblies, and respective ones of the solid state light sources on the solid state lighting tiles of a bar assembly are electrically connected in series so as to be simultaneously energized upon application of a voltage thereto. Methods of forming a solid state lighting unit are also disclosed.

60 Claims, 6 Drawing Sheets

U.S. PATENT DOCUMENTS

| | | |
|---|---|---|
| 6,576,930 B2 | 6/2003 | Reeh et al. |
| 6,630,801 B2 | 10/2003 | Schuurmans |
| 6,674,060 B2 | 1/2004 | Antila |
| 6,741,351 B2 | 5/2004 | Marshall et al. |
| 6,809,347 B2 | 10/2004 | Tasch et al. |
| 6,836,081 B2 | 12/2004 | Swanson et al. |
| 6,841,804 B1 | 1/2005 | Chen et al. |
| 6,841,947 B2 | 1/2005 | Berg-johansen |
| 6,857,767 B2 * | 2/2005 | Matsui et al. ............... 362/373 |
| 6,936,857 B2 | 8/2005 | Doxsee et al. |
| 7,009,343 B2 | 3/2006 | Lim et al. |
| 7,023,543 B2 | 4/2006 | Cunningham |
| 7,135,664 B2 | 11/2006 | Vornsand et al. |
| 7,140,752 B2 | 11/2006 | Ashdown |
| 7,173,384 B2 | 2/2007 | Plotz et al. |
| 7,186,000 B2 | 3/2007 | Lebens et al. |
| 7,202,608 B2 | 4/2007 | Robinson et al. |
| 7,208,713 B2 | 4/2007 | Ishiguchi |
| 7,213,940 B1 | 5/2007 | Van De Ven et al. |
| 7,256,557 B2 | 8/2007 | Lim et al. |
| 7,549,784 B1 * | 6/2009 | Teeters ..................... 362/576 |
| 7,690,812 B2 * | 4/2010 | Roberts et al. ............ 362/247 |
| 2002/0003592 A1 * | 1/2002 | Hett et al. .................... 349/58 |
| 2002/0190972 A1 | 12/2002 | Ven de Van |
| 2003/0089918 A1 | 5/2003 | Hiller et al. |
| 2004/0208210 A1 | 10/2004 | Inoguchi |
| 2004/0262623 A1 | 12/2004 | You |
| 2005/0024834 A1 | 2/2005 | Newby |
| 2006/0007553 A1 | 1/2006 | Bogner et al. |
| 2006/0105482 A1 | 5/2006 | Alferink et al. |
| 2006/0187660 A1 * | 8/2006 | Liu ........................... 362/294 |
| 2007/0247414 A1 | 10/2007 | Roberts |

FOREIGN PATENT DOCUMENTS

| | | |
|---|---|---|
| WO | WO 2004032235 A2 | 4/2004 |
| WO | WO 2007/061758 A1 | 5/2007 |

OTHER PUBLICATIONS

U.S. Appl. No. 12/257,804, filed Oct. 24, 2008, Negley.

Perduijn et al, "Light Output Feedback Solution for RGB LED Backlight Applications", SID 2003 Digest 43.2/A.

Zhu et al., "Optimizing the Performance of Remote Phosphor LED, First International Conference on White LEDs and Solid State Lighting", 5 pages, Japan (Nov. 26-30, 2007).

International Search Report and Written Opinion (9 pages) corresponding to International Application No. PCT/US07/12707; Mailing Date: Aug. 21, 2008.

* cited by examiner

SOLID STATE LIGHTING UNITS AND METHODS OF FORMING SOLID STATE LIGHTING UNITS

CROSS-REFERENCE TO RELATED APPLICATIONS

This application claims the benefit of and priority to U.S. Provisional Patent Application No. 60/738,305 entitled "SYSTEM AND METHOD FOR INTERCONNECTION AND INTEGRATION OF LED BACKLIGHTING MODULES" filed Nov. 18, 2005, and U.S. Provisional Patent Application No. 60/749,133 entitled "SOLID STATE BACKLIGHTING UNIT ASSEMBLY AND METHODS" filed Dec. 9, 2005, the disclosures of which are hereby incorporated herein by reference as if set forth in their entirety.

FIELD OF THE INVENTION

The present invention relates to solid state lighting, and more particularly to solid state lighting panels including solid state lighting components.

BACKGROUND

Solid state lighting panels may be used as solid state backlight units for displays, as lighting panels for general illumination, as backlights for signage, and/or for other purposes. Solid state backlighting units for LCD displays typically include a two dimensional array of discrete light sources arranged behind an LCD screen. The discrete light sources may generate light having a white or near-white color that may be used to illuminate an LCD display, such as a full-color LCD display. In order for the LCD display to display an image on the screen having uniform color and/or intensity, it may be desirable for the backlight unit to provide a light to the LCD screen that is spatially uniform, both in color and intensity. This may be difficult, however, as the discrete light sources may be spaced apart from each other in the backlight unit. In particular, as the brightness of solid state light sources increases, it may be desirable to arrange the light sources with a larger and larger pitch between sources, for example, in order to reduce heat dissipation and/or to increase the efficiency of the display.

Similar problems relating to color uniformity, efficiency and/or heat dissipation may arise when solid state lighting units including arrays of solid state light emitting devices are used for general illumination.

SUMMARY

A solid state lighting unit according to some embodiments of the invention includes a plurality of solid state lighting tiles including a planar surface and a plurality of solid state light sources on the planar surface. The lighting unit includes a plurality of bar support members. Respective ones of the bar support members include at least two of the plurality of tiles affixed thereon to form respective bar assemblies, and respective ones of the solid state light sources on the solid state lighting tiles of a bar assembly are electrically connected in series so as to be simultaneously energized upon application of a voltage thereto.

The solid state lighting unit may further include a panel support member, and the plurality of bar assemblies may be affixed to the panel support member on a side of the bar support members of the bar assemblies opposite the solid state lighting tiles.

The panel support member may include a cover bottom affixed to the plurality of bar assemblies opposite the plurality of solid state lighting tiles.

The solid state lighting unit may further include a thermal spreader on the cover bottom. The thermal spreader may be between the cover bottom and the plurality of bar assemblies and/or the cover bottom may be between the thermal spreader and the plurality of bar assemblies. In some embodiments, the thermal spreader may include a first thermal spreader between the cover bottom and the plurality of bar assemblies, and the solid state lighting unit may further include a second thermal spreader on the cover bottom such that the cover bottom is between the first thermal spreader and the second thermal spreader. The thermal spreader may include a sheet of thermally conductive material configured to conduct heat generated by the solid state lighting devices to the cover bottom and to reduce thermal nonuniformities in the solid state lighting unit by spreading the conducted heat over the area of the thermal spreader.

Each of the plurality of bar assemblies may include a thermally conductive elongate member, and the plurality of bar assemblies may be arranged side by side in the solid state lighting unit. Each of the bar assemblies may further include a loopback connector at an end of the bar assembly.

The solid state lighting unit may further include a plurality of spacers between adjacent ones of the solid state lighting tiles on a respective bar assembly. Each of the plurality of spacers may include a nonconductive elastomeric material. In some embodiments, each of the plurality of spacers may include a protrusion configured to mate with a corresponding recess in at least one of the adjacent solid state lighting tiles.

Respective ones of the tiles may include electrical pads on the planar surface thereof, and the solid state lighting unit may further include a wire loop extending between electrical pads on adjacent tiles to electrically interconnect the electrical pads of adjacent tiles across a spacer between the tiles. The height of the wire loop from the planar surface may be between about 0.02 and about 0.12 inches. An insulating material may be on the wire loop.

The electrical pads may be in electrical communication with one or more of LED chips through circuit traces on the tile such that when sufficient voltage is applied across the electrical pads, current flows through the light sources and the light sources emit useful light.

The solid state lighting unit may further include a reflector panel on the plurality of lighting tiles. The reflector panel may include a diffuse reflector. The reflector panel may include a plurality of circular apertures therein that are aligned with respective ones of the plurality of solid state lighting elements. The apertures circular apertures may have sidewalls that form an angle with the planar surface of the tiles.

The solid state lighting unit may further include a plurality of pins including a body and a head. The reflector panel may be attached to the tiles using the pins, and the pins may extend through a hole in the reflector panel and into a corresponding hole in a tile. The pins may include a diffuse reflective material. Further, the pins may extend into the tiles but not into the bar support members.

The solid state lighting unit may further include a fastener extending between at least one of the bar support members and the panel support member. The fastener may have a head on a side of the bar support member opposite the panel support member, and the head may be disposed within an aperture in a tile and has a height less than a height of the tile. The head is spaced apart from the tile such that it is not in contact with the tile.

The solid state lighting unit may further include a reflector panel on the plurality of lighting tiles. The solid state lighting unit may further include a plurality of pins including a body and a head. The reflector panel may be attached to the tiles using the pins, and the pins may extend through a hole in the reflector panel and into a corresponding hole in a tile. The pins may extend into the tiles but not into the bar support members.

A solid state lighting unit according to further embodiments of the invention includes a panel support member, and a plurality of solid state lighting tiles. Each of the solid state lighting tiles includes a planar surface and a plurality of solid state light sources on the planar surface. The solid state lighting unit further includes a plurality of bar support members. Respective ones of the bar support members include at least two of the plurality of tiles affixed thereon to form respective bar assemblies, and the bar assemblies are mounted on the panel support member such that the bar support members are between the panel support member and the tiles.

The solid state lighting unit may further include a thermal spreader between the panel support member and the plurality of bar assemblies. The thermal spreader may include a sheet of thermally conductive material having an area and configured to conduct heat generated by the solid state lighting devices to the panel support member and to reduce thermal nonuniformities in the solid state lighting unit by spreading the conducted heat over the area of the thermal spreader.

The solid state lighting unit may further include a reflector panel on the plurality of lighting tiles. The solid state lighting unit may further include a plurality of pins including a body and a head. The reflector panel may be attached to the tiles using the pins, and the pins may extend through a hole in the reflector panel and into a corresponding hole in a tile. The pins may extend into the tiles but not into the bar support members.

The solid state lighting unit may further include a fastener extending between at least one of the bar support members and the panel support member. The fastener has a head on a side of the bar support member opposite the panel support member. The head may be disposed within an aperture in a tile and has a height less than a height of the tile. The head may be spaced apart from the tile such that it is not in contact with the tile.

A solid state lighting unit according to further embodiments of the invention includes at least one bar support member, first and second solid state lighting tiles on the bar support member, and a nonconductive spacer between the first and second solid state lighting tiles. The spacer may include a nonconductive elastomeric material. The spacer may include a protrusion configured to mate with a corresponding recess in at least one of the first or second solid state lighting tiles.

The solid state lighting unit may further include electrical pads on surfaces of the first and second tiles opposite the bar support member, and a wire loop extending between the electrical pads to electrically interconnect the electrical pads across the spacer. The height of the wire loop from the planar surface may be between about 0.02 and about 0.12 inches.

The solid state lighting unit may further include a plurality of parallel wire loops extending between the electrical pads to provide a redundant electrical interconnection between the electrical pads.

The solid state lighting unit may further include first and second adjacent electrical contacts on a surface of the first lighting tile opposite the bar support member, and third and fourth adjacent electoral contacts on a surface of the second lighting tile opposite the bar support member. A first wire loop may extend between the first electrical pad of the first lighting tile and the third electrical pad of the second lighting tile to electrically interconnect the first and third electrical pads across the spacer, and a second wire loop may extend between the second electrical pad of the first lighting tile and the fourth electrical pad of the second lighting tile to electrically interconnect the second and fourth electrical pads across the spacer. The first and second wire loops may be spaced apart by a distance d that is at least about equal to a height h of the first and second wire loops from the surfaces of the first and second lighting tiles.

The height h of the first and second wire loops may be less than about half of the distance d between the first and second wire loops.

A solid state lighting tile according to some embodiments of the invention includes a substrate having a planar surface, a plurality of first strings of series-connected LEDs on the substrate, the first strings having respective anode contacts at a first end of the tile and cathode contacts at a second end of the tile opposite the first end, and a plurality of second strings of series-connected LEDs, the second strings having respective anode contacts at the second end of the tile and cathode contacts at the first end of the tile. Each of the plurality of first strings and the plurality of second strings may include at least a first color string of LEDs configured to emit light having a first wavelength when energized and a second color string of LEDs configured to emit light having a second wavelength when energized. The cathode contact of the first color string of the first plurality of strings and the anode contact of the first color string of the second plurality of strings are offset in a direction parallel to the longitudinal center axis of the tile from the cathode contact of the second color string of the first plurality of strings and the anode contact of the second color string of the second plurality of strings.

The cathode contact of the first color string of the first plurality of strings and the anode contact of the first color string of the second plurality of strings may be farther from the second end of the tile than the cathode contact of the second color string of the first plurality of strings and the anode contact of the second color string of the second plurality of strings.

Some embodiments of the invention provide methods of forming a solid state lighting bar assembly including a bar support member including a plurality of registration holes and a plurality of solid state lighting tiles including at least one registration hole each. The methods may include placing the bar support member on a jig including at least one alignment pin so that the alignment pin extends through one of the plurality of registration holes in the bar support member, placing one of the plurality of tiles on the bar support member such that the alignment pin extends through the registration hole in the tile, and affixing the tile to the bar support member.

Affixing the tile to the bar support member may include dispensing epoxy glue on the bar support member before placing the tile on the bar support member.

The methods may further include placing a second tile including a contact pad adjacent an end thereof on the jig such that a second alignment pin extends through a registration hole in the second tile and such that the end of the second tile is adjacent the end of the first tile, and electrically connecting the contact pad of the first tile and the contact pad of the second tile.

Electrically connecting the contact pad of the first tile and the contact pad of the second tile may include forming a loop connection between the contact pad of the first tile and the contact pad of the second tile. The height of the loop connection may be between about 0.02 and about 0.12 inches. Forming a loop connection between the contact pad of the first tile and the contact pad of the second tile may include forming a plurality of parallel loop connections between the contact pad of the first tile and the contact pad of the second tile. An insulating material may be formed on the loop connection.

The first tile may include first and second contact pads and the second tile may include first and second contact pads, and the methods may further include forming a first loop connection between the first contact pad of the first tile and the first contact pad of the second tile and forming a second loop connection between the second contact pad of the first tile and the second contact pad of the second tile. The first and second loop connections may be spaced apart by a distance d that is at least about equal to a height h of the first and second loop connections. The height h of the first and second loop connections may be less than about half of the distance d between the first and second loop connections.

Electrically connecting the contact pad of the first tile and the contact pad of the second tile may include providing a wire ribbon connection between the first tile and the second tile.

The methods may further include providing an insulating spacer between the first tile and the second tile. Providing an insulating spacer between the first tile and the second tile may include dispensing a liquid sealant in a seam between the first tile and the second tile and curing the dispensed liquid sealant. In some embodiments, providing an insulating spacer between the first tile and the second tile may include pressing a pre-formed insulating member in a seam between the first tile and the second tile. The preformed insulating member may include a protrusion configured to mate with a corresponding recess in an edge of the first or second tile.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
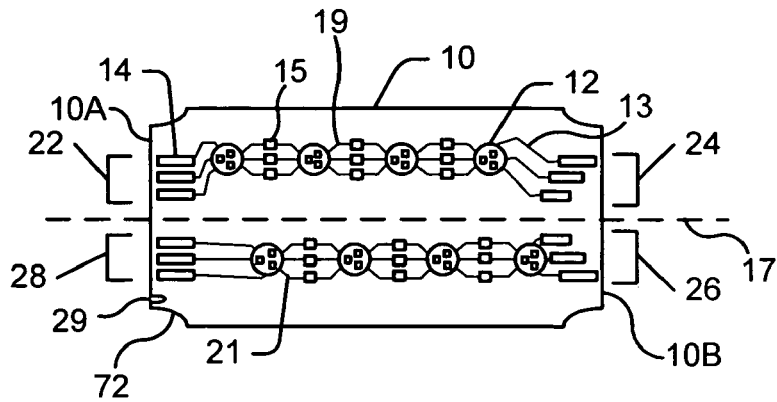
FIG. 1 is a plan view illustration of a tile for a solid state lighting unit according to some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Referring now to FIG. 1, a solid state lighting tile 10 for use in a solid state lighting unit may include thereon a number of solid state lighting element clusters 12 arranged in a regular and/or irregular two dimensional array. The tile 10 may include, for example, a printed circuit board (PCB) on which one or more circuit elements may be mounted. In particular, a tile 10 may include a metal core PCB (MCPCB) including a metal core having thereon a polymer coating on which patterned metal traces 13 may be formed. MCPCB material, and material similar thereto, is commercially available from, for example, The Bergquist Company. The PCB may further include heavy clad (4 oz. copper or more) and/or conventional FR-4 PCB material with thermal vias. MCPCB material may provide improved thermal performance compared to conventional PCB material. However, MCPCB material may also be heavier than conventional PCB material, which may not include a metal core.

In the embodiments illustrated in FIG. 1, the lighting element clusters 12 are multi-chip clusters of three solid state emitting devices per cluster. In the tile 10, four lighting element clusters 12 are serially arranged in a first path 19, while four lighting element clusters 12 are serially arranged in a second path 21. The lighting element clusters 12 of the first path 19 are connected, for example via electrical traces 13, to a set of three anode contacts 22 arranged at a first end 10A of the tile 10, and a set of three cathode contacts 24 arranged at a second end 10B of the tile 10. The lighting element clusters 12 of the second path 21 are connected to a set of three anode contacts 26 arranged at the second end 10B of the tile 10, and a set of three cathode contacts 28 arranged at the first end 10A of the tile 10. The tile 10 may further include electrical test pads 15 between the lighting element clusters 12. The electrical test pads 15 are configured to permit individual testing of the light emitting devices of the lighting element clusters 12.

An alignment notch 29 may be provided in the tile 10 to assist connection of an edge connector (not shown) and also to prevent incorrect installation of the edge connector. Furthermore, notches 33 may be provided in the corners of the tiles 10 to avoid contact between a reflector panel 40 (FIG. 7) and/or tile 10 and the screws of a panel support member 44 and/or bar support member 20 (FIG. 8) on which the tile 10 is mounted. The tile 10 may further include one or more automation indexing holes (not shown) that may be used to move the tile 10 during automated manufacturing steps.

Figure 2:
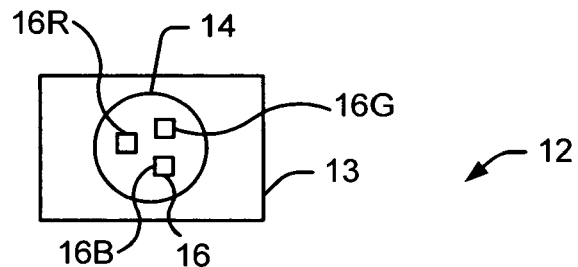
FIG. 2 is a plan view illustration of a solid state light source for a solid state lighting unit according to some embodiments of the invention.

The solid state lighting element clusters 12 may include, for example, organic and/or inorganic light emitting devices. An example of a solid state lighting element cluster 12 for high power illumination applications is illustrated in FIG. 2. A solid state lighting element cluster 12 may include a packaged discrete electronic component including a carrier substrate 13 on which a plurality of LED chips 16 are mounted. In other embodiments, one or more solid state lighting element clusters 12 may include LED chips 16 mounted directly onto electrical traces on the surface of the tile 10, forming a multi-chip module or chip-on-board assembly.

The LED chips 16 may include at least a red LED 16R, a green LED 16G and a blue LED 16B. The blue and/or green LEDs may include InGaN-based blue and/or green LED chips available from Cree, Inc., the assignee of the present invention. The red LEDs may be, for example, AlInGaP LED chips available from Epistar, Osram and others. The lighting device 12 may include an additional green LED in order to make more green light available.

In some embodiments, the LEDs 16 may have a square or rectangular periphery with an edge length of about 900 µm or greater (i.e. so-called "power chips." However, in other embodiments, the LED chips 16 may have an edge length of 500 µm or less (i.e. so-called "small chips"). In particular, small LED chips may operate with better electrical conversion efficiency than power chips. For example, green LED chips with a maximum edge dimension less than 500 microns, and as small as 260 microns, commonly have a higher electrical conversion efficiency than 900 micron chips, and are known to typically produce 55 lumens of luminous flux per Watt of dissipated electrical power and as much as 90 lumens of luminous flux per Watt of dissipated electrical power.

As further illustrated in FIG. 2, the LEDs 16 may be covered by an encapsulant dome 14, which may be clear and/or may include light scattering particles, phosphors, and/or other elements to achieve a desired emission pattern, color and/or intensity. The encapsulant dome 14, which may include a curable silicone or epoxy resin, may provide mechanical and/or environmental protection for the LEDs 16. While not illustrated in FIG. 2, the lighting element cluster 12 may further include a reflector cup surrounding the LEDs 16, a lens mounted above the LEDs 16, one or more heat sinks for removing heat from the lighting device, an electrostatic discharge protection chip, and/or other elements.

Figure 3:
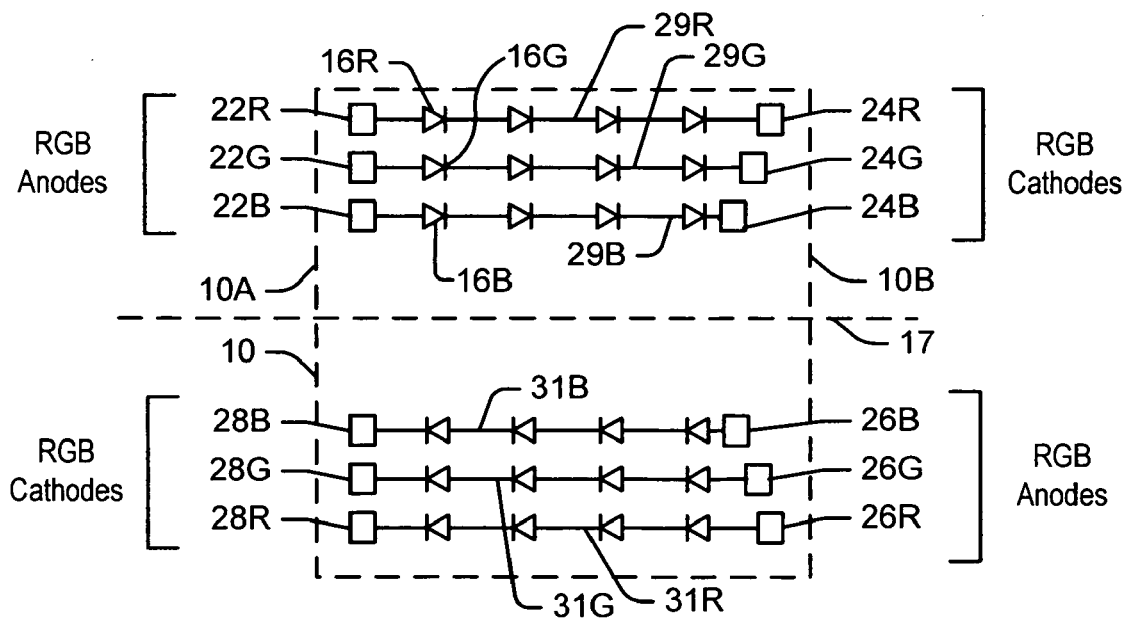
FIG. 3 is a circuit diagram illustrating the electrical interconnection of light sources on a tile according to some embodiments of the invention.

The LED chips 16 of the lighting element clusters 12 in the tile 10 may be electrically interconnected as shown in the schematic circuit diagram in FIG. 3. As shown therein, the LEDs 16 may be interconnected such that the blue LEDs 16B in the first path 19 are connected in series to form a string 30B. Likewise, the green LEDs 16G in the first path 19 may be arranged in series to form a string 30G. The red LEDs 16R may be arranged in series to form a string 30R. Each string 30R, 30G, 30B may be connected to a respective anode contact 22R, 22G, 22B arranged at a first end of the tile 10 and a cathode contact 24 arranged at the second end of the tile 10, respectively.

A string 30R, 30G, 30B may include all, or less than all, of the corresponding LEDs in the first path 19. For example, the string 30B may include all of the blue LEDs 16B from all of the lighting element clusters 12 in the first path 19. Alternatively, a string 30R, 30G, 30B may include only a subset of the corresponding LEDs in the first path 19. Accordingly the first path 19 may include three strings 30R, 30G, 30B arranged in parallel on the tile 10.

The second path 21 on the tile 10 may include three strings 31R, 31G, 31B arranged in parallel. The strings 31R, 31G, 31B are connected to anode contacts 26R, 26G, 26B, which are arranged at the second end of the tile 10 and to cathode contacts 28R, 28G, 28B, which are arranged at the first end of the tile 10, respectively.

The first group of strings 30R, 30G, 30B have anode contacts 22R, 22G and 22B generally adjacent a first end 10A of the tile 10 and cathode contacts 24R, 24G, 24B generally adjacent a second end 10B of the tile 10. The second group of strings 31R, 31G, 31B have anode contacts 26R, 26G and 26B generally adjacent the second end 10B of the tile 10 and cathode contacts 28R, 28G, 28B generally adjacent the first end 10A of the tile 10.

As shown in FIGS. 1 and 3, The tile 10 may have a longitudinal center axis 17, and the first group of strings 30R, 30G, 30B and the second group of strings 31R, 31G, 31B may run generally parallel to the longitudinal center axis 17.

The anode and cathode contacts of a first color string of the first group of strings and the anode and cathode contacts of the first color string of the second group of strings may be disposed nearer to the longitudinal center axis 17 of the tile 10 than the anode and cathode contacts of the second and/or third color strings of the first and second groups of strings. For example, the anode and cathode contacts 22B, 24B, 26B, 28B of the blue strings 30B and 31B may be disposed closer to the longitudinal center axis 17 than the anode and cathode contacts 22G, 24G, 26G, 28G of the green strings 30G and 31G. Likewise, the anode and cathode contacts 22G, 24G, 26G, 28G of the green strings 30G and 31G may be disposed closer to the longitudinal center axis 17 than the anode and cathode contacts 22R, 24R, 26R, 28R of the red strings 30R and 31R.

The cathode contact of a first color string of the first group of strings and the anode contact of the first color string of the second group of strings may be offset in a direction parallel to the longitudinal center axis 17 of the tile 10 from the cathode contact of a second color string of the first group of strings and the anode contact of the second color string of the second group of strings. In particular, the cathode contact of the first color string of the first group of strings and the anode contact of the first color string of the second group of strings may be farther from an end 10A, 10B of the tile 10 than the cathode contact of the second color string of the first group of strings and the anode contact of the second color string of the second group of strings.

For example as shown in FIG. 3, the cathode contact 24B of the blue string 30B and the anode contact 26B of the blue string 31B may be disposed farther from the end 10B of the tile 10 than the cathode contact 24G of the green string 30G and the anode contact 26G of the green string 31G. Staggering the contacts from the end 10B of the tile 10 may facilitate connecting the contacts of the respective strings, for example to form a loopback connector using wire loops.

It will be appreciated that, while the embodiments illustrated in FIGS. 1-3 include three LED chips 16 per cluster 12 which are electrically connected to form at least three strings of LEDs 16 per path 19, 21, more and/or fewer than three LED chips 16 may be provided per lighting device 12, and more and/or fewer than three LED strings may be provided per path 19, 21 on the tile 10. For example, a cluster 12 may include two green LED chips 16G, in which case the LEDs may be connected to form four strings per path 19, 21. Likewise, in some embodiments including two green LED chips per cluster 12, the two green LED chips in a cluster 12 may be connected in series to one another, in which case there may only be a single string of green LED chips per path 19, 21. Further, a tile 10 may include only a single path 19 instead of plural paths 19, 21 and/or more than two paths 19, 21 may be provided on a single tile 10.

Figure 4:
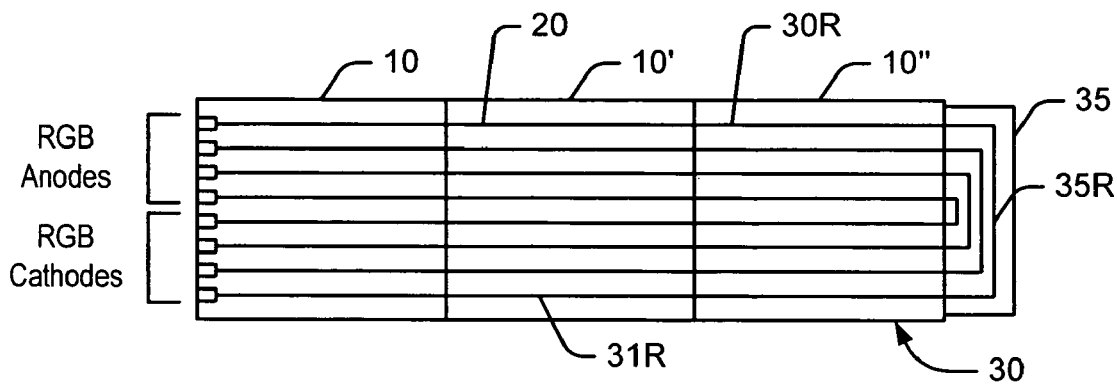
FIG. 4 is a plan view illustration of a bar assembly for a solid state lighting panel according to some embodiments of the invention.

Multiple tiles 10 may be assembled to form a larger lighting bar assembly 30 as illustrated in FIG. 4. As shown therein, a bar assembly 30 may include two or more tiles 10, 10', 10" connected end-to-end. Accordingly, referring to FIGS. 3 and 4, the cathode contacts 24 of the first path 19 of the leftmost tile 10 may be electrically connected to the anode contacts 22 of the first path 19 of the central tile 10', and the cathode contacts 24 of the first path 19 of the central tile 10' may be electrically connected to the anode contacts 22 of the first path 19 of the rightmost tile 10", respectively. Similarly, the anode contacts 26 of the second path 21 of the leftmost tile 10 may be electrically connected to the cathode contacts 28 of the second path 21 of the central tile 10', and the anode contacts 26 of the second path 21 of the central tile 10' may be electrically connected to the cathode contacts 28 of the second path 21 of the rightmost tile 10", respectively.

Furthermore, the cathode contacts 24 of the first path 19 of the rightmost tile 10" may be electrically connected to the anode contacts 26 of the second path 21 of the rightmost tile 10" by a loopback connector 35. For example, the loopback connector 35 may electrically connect the cathode 24R of the string 30R of red LED chips 16R of the first path 19 of the rightmost tile 10" with the anode 26R of the string 31R of red LED chips of the second path 21 of the rightmost tile 10". In this manner, the string 30R of the first path 19 may be connected in series with the string 31R of the second path 21 by a conductor 35R of the loopback connector 35 to form a single string of red LED chips 16R. The other strings of the paths 19, 21 of the tiles 10, 10', 10" may be connected in a similar manner.

The loopback connector 35 may include an edge connector, a flexible wiring board, or any other suitable connector. In addition, the loop connector may include printed traces and/or wire loops formed on/in the tile 10".

While the bar assembly 30 shown in FIG. 4 is a one dimensional array of tiles 10, other configurations are possible. For example, the tiles 10 could be connected in a two-dimensional array in which the tiles 10 are all located in the same plane, or in a three dimensional configuration in which the tiles 10 are not all arranged in the same plane. Furthermore the tiles 10 need not be rectangular or square, but could, for example, be hexagonal, triangular, or the like.

Figure 5:
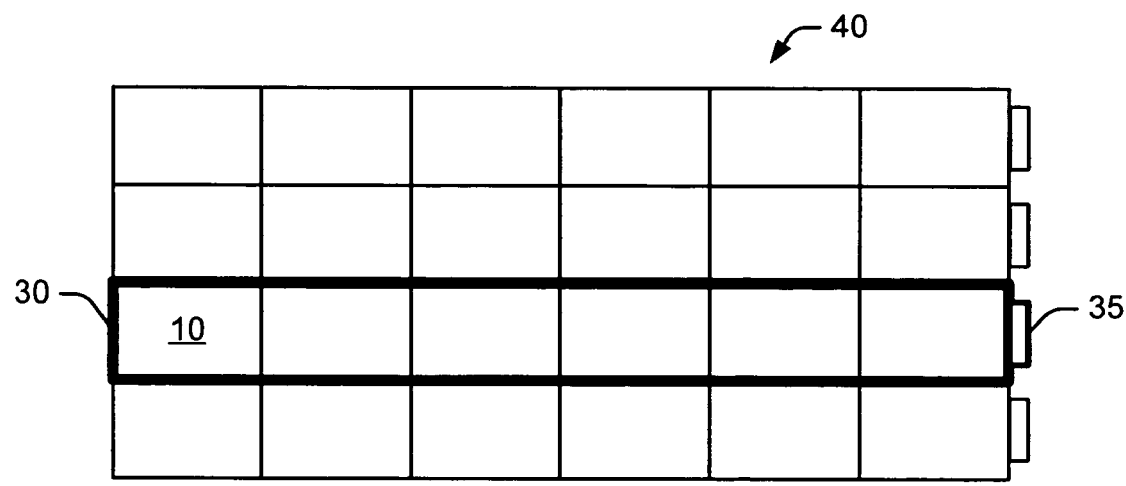
FIG. 5 is a plan view illustration of a solid state lighting panel including a plurality of bar assemblies, according to some embodiments of the invention.

Referring to FIG. 5, in some embodiments, a plurality of bar assemblies 30 may be combined to form a lighting panel 40, which may be used, for example, as a backlighting unit (BLU) for an LCD display and/or as a lighting panel for general illumination. As shown in FIG. 5, a lighting panel 40 may include four bar assemblies 30, each of which includes six tiles 10. The rightmost tile 10 of each bar assembly 30 includes a loopback connector 35. Accordingly, each bar assembly 30 may include three strings of LEDs (i.e. one red, one green and one blue).

In some embodiments, a bar assembly 30 may include three LED strings (one red, one green and one blue). Thus, a lighting panel 40 including nine bar assemblies may have 27 separate strings of LEDs. Moreover, in a bar assembly 30 including six tiles 10 with eight solid state lighting element clusters 12 each, an LED string may include 48 LEDs connected in series.

Figure 6A:
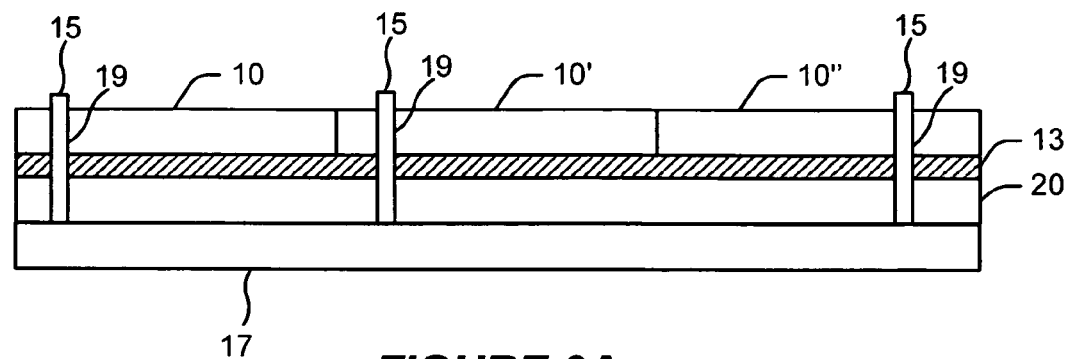
FIG. 6A is cross sectional illustration of a plurality of tiles mounted on a bar in accordance with some embodiments of the invention.
Figure 6B:
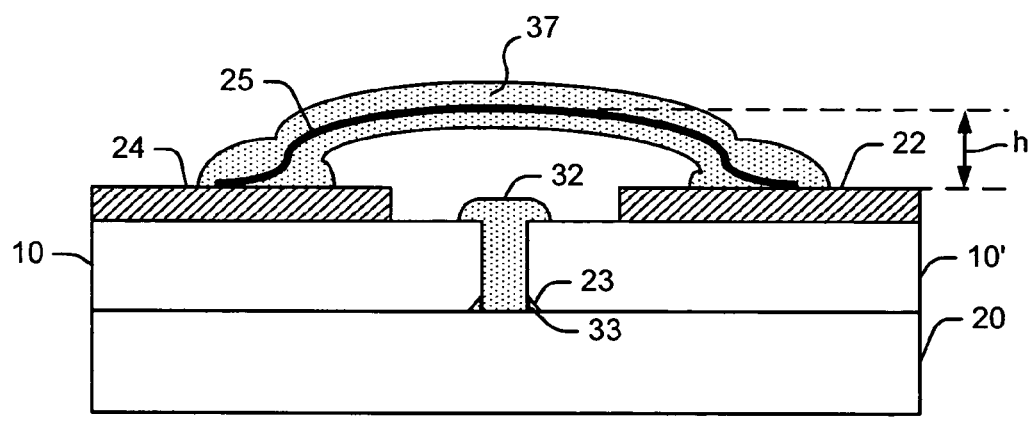
FIG. 6B is a cross sectional detail illustration of adjacent tiles mounted on a bar in accordance with some embodiments of the invention.
Figure 6C:
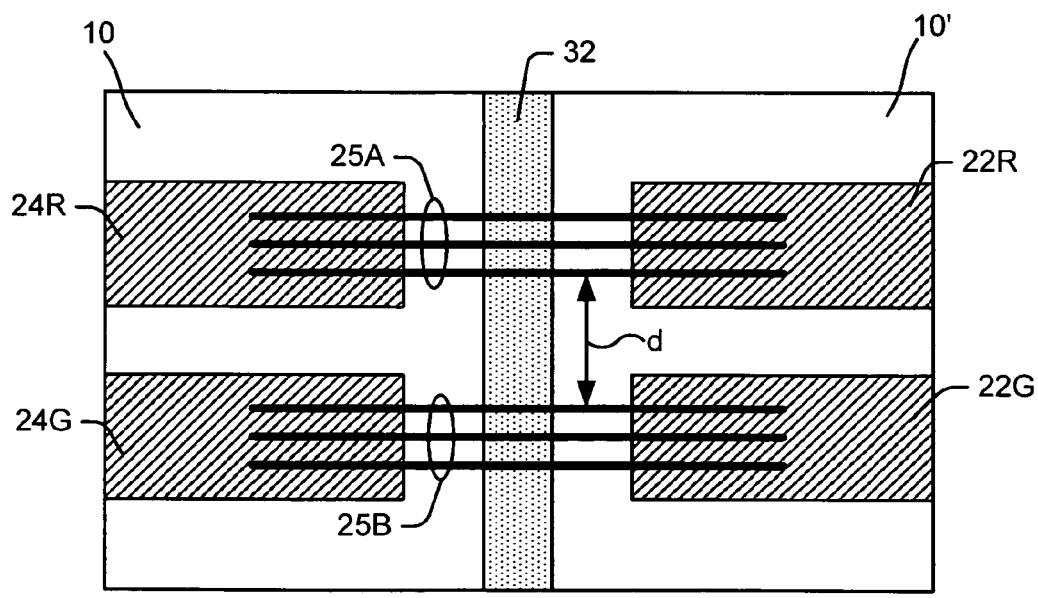
FIG. 6C is a plan view detail illustration of the interconnection of two adjacent tiles on a bar, according to some embodiments of the invention.
Figure 13:
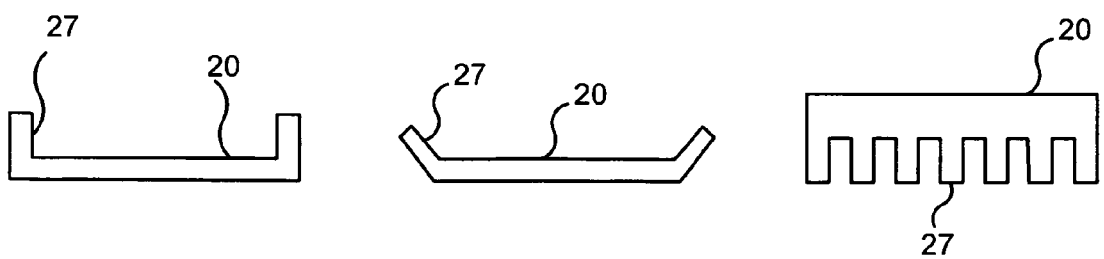
FIG. 13 illustrates cross-sectional views of bar support members according to some embodiments of the invention.

Referring to FIGS. 6A to 6C, a plurality of tiles 10 may be assembled end-to-end onto a bar support member 20, which may provide mechanical support and/or thermal dissipation for the tiles 10. The bar support member 20 may include a material that is lightweight, strong and/or has a high thermal conductivity. For example, the bar support member 20 may include a metal such as aluminum. The bar support member 20 may have a thickness of about 0.020" to about 0.10". In general, the thickness of the bar support member 20 may affect the stiffness of the bar support member. Thus, a thicker bar support member 20 may have increased resistance to stress and vibration, which may improve the reliability of the lighting unit. The rigidity of a bar support member 20 may be further increased, without substantially increasing the weight of the bar support member 20, by providing one or more longitudinally extending ridges or flanges 27 along a surface or edge of the bar support member 20, as shown in the cross-sectional illustrations of FIG. 13.

The tiles 10 may be affixed onto the bar support member 20 using, for example, a thin film of adhesive 13. During assembly, the tiles 10 may be aligned on the bar support member 20 by means of registration pins 15 in a jig 17 that may extend through matching through holes 19 in the bar support member 20 and the tiles 10. The adhesive may include a thin acrylic PSA such as 3M VLB series types having a thickness of 0.005" or less, or 3M 4905, or similar adhesives, or a liquid-dispersed interface such as RTV, or epoxy, or other adherent or thermal interface.

The adhesive used to affix the tiles 10 to the bar support member 20 may or may not be highly thermally conductive. While the bar support member 20 may act as a common heatsink to provide enhanced thermal dissipation for the tiles 10, the adhesive used to affix the tiles 10 to the bar support member 20 may provide a negligible thermal resistance due to its small thickness.

The tiles 10 on the bar support member 20 may be electrically interconnected as shown in FIG. 6B, which is a detail illustration of a region where two tiles 10, 10' meet at opposing ends thereof. For example, the tiles 10, 10' may be electrically interconnected by means of wire loop interconnects 25 extending between adjacent tiles 10, 10'. In that way, the adjacent anode and cathode electrical pads 22, 24 on tiles 10, 10' may be interconnected in a desired manner. For example, same-color LED strings 30, 31 on the tiles 10, 10' may be connected in a single string having a single cathode connection at one end of the bar assembly 30 and a single anode connection at the other end of the bar assembly 30.

Accordingly, each color of LEDs on a bar support member 20 may be energized by application of a single voltage. The loop interconnects 25 may moreover accommodate minor flexure between adjacent tiles, for example, during assembly, shipment and/or use.

In some embodiments, as illustrated in FIG. 6C, which is a top plan detail illustration of a region where two tiles 10, 10' meet at opposing ends thereof, more than one loop interconnect 25 may be provided between respective pads 22 on adjacent tiles 10, 10' in order to provide a redundant electrical connection. Furthermore, as shown in FIG. 6C, the right tile 10' may include first and second electrical pads 22R and 22G, which may correspond to the anode contacts for the red and green strings of a tile 10. The cathode contact 24R on the left tile 10 may be electrically connected to a corresponding anode contact 22R on the adjacent tile 10' via a first group of parallel loop interconnects 25A. Likewise, the cathode contact pad 24G on the left tile 10 may be electrically connected to a corresponding anode contact pad 22G on the adjacent tile 10' via a second group of parallel loop interconnects 25B. The first and second groups of parallel loop interconnects 25A, 25B may be spaced apart by a distance d to reduce the possibility of an electrical short between the loop interconnects 25A, 25B.

The height of the loop interconnects 25 (shown as h in FIG. 6B) may be made high enough to accommodate flexure of the bar assembly 30, but not so high as to deform, or be deformed by, a reflector panel 40 (FIG. 7) that may be provided above the tiles 10. Accordingly, the loop interconnects 25 may have a height h of between about 0.02" and about 0.12". The loop interconnects 25 may be formed using conventional large wire interconnect (LWI) techniques, as discussed below.

In general, it may be desirable to provide a high reliability, low cost electrical interconnect in order to establish electrical continuity across a gap between adjacent tiles 10, 10'.

According to some embodiments of the present invention, the tiles 10 include two or more contact pads 22, 24 in electrical communication with one or more of the LED chips through circuit traces or vias on the tile 10, or by other means, such that when a sufficient forward bias voltage potential is applied across the two pads 22, current flows through at least one light source 16, causing it to emit useful light.

By placing the tiles 10, 10' end-to-end and interconnecting them serially in a circuit, light sources on more than one tile may be illuminated simultaneously, provided that a sufficient voltage potential is applied. With additional interconnections, more tiles 10 may be arranged in physical proximity with each other. Such a configuration may have many advantages, in that it may facilitate the construction of a wide range of distributed illumination sources from a single tile design that is compact, standard and simple. Such a distributed illumination source may have the further advantage of spreading emitted light quite directly and efficiently over the large areas, such as may be typically desirable for backlit LCD display panels, for backlit signage, for office illumination, or for other applications.

A distributed architecture may also provide for the wide and/or uniform distribution of dissipated heat, directly and without additional thermal dissipation means. Typically, if the circuit substrate is of MCPCB or a heavy clad material, or a conventional FR-4 with thermal vias, then the distributed light source may be mounted on an aluminum backplate or an anisotopic carbon backplate, and no other major thermal dissipation or spreading means may be needed in a system. In particular, a cooling fan may not be needed.

However, with such an architecture, the distributed light source of interconnected tiles 10 may be subject to mechanical stress and strain, including flexure that may be encountered during assembly of the tiles 10 into a display 100 or backlighting assembly 10 or that may be experienced in the backlighting assembly 10 itself over time, especially during contraction and/or expansion caused by cooling and heating cycles. Additionally, a distributed light source with interconnected tiles 10 may need to be large relative to the size of the interconnected tiles 10, such as when the tiles 10 are small and/or the display 100 is relatively large in area.

In some embodiments, a relatively large number of interconnects 25 may be needed between tiles 10 to complete all of the desired circuits. Thus, the cost of forming the interconnects 25 and the failure rate of such interconnects 25 may be a concern. Thus, it may be desirable for the interconnects 25 to be relatively inexpensive. In addition, the interconnects 25 may be robust with respect to temperature cycling and the resulting expansion/contraction cycles. Furthermore, the interconnects 25 may accommodate loads and/or flexure without failing too readily, and may be electrically and/or physically compatible with the tiles 10 and the system in which the tiles 10 are employed. The interconnects 25 may also establish and maintain a low resistance electrically continuous interface through normal product life exposures. In some embodiments, the interconnect 25 may have a very low profile, protruding very little above the plane of the tiles 16 upon which the light sources 14 are mounted, so as not to interfere with optical performance of the light sources 14 or other constituents of the system, such as reflector panels that may be mounted on the tiles 10.

In some embodiments of the present invention, the interconnects may include "large wire" aluminum wirebonds formed by ultrasonic wedgebonding. Such interconnects 25 may be extremely rugged, reliable, inexpensive, and/or may be made at high speed on automated machinery, such as equipment available from F&K Delvotec. A1 wirebonds for 0.008" and 0.012" aluminum wire on gold pads on the tiles 10 have been demonstrated to have pull strengths in excess of 500 gm and wedge shear strength in excess of 1000 gm. Another advantage of such interconnects 25 is that the bonds may be made ultrasonically, without any external heat applied to the tiles 10. Because the interconnects 25 may be formed after formation of the light sources 14, excessive heat applied during the formation of interconnects may harm the light sources 14. For example, excessive heat may adversely affect solder, encapsulants, adhesives and/or other materials included in the light sources 14.

Such large wire interconnects 25, while strong, may also be relatively small, such that the pads 22 on the tiles 10 may be made relatively small, thereby preserving space on the tile. This in turn may allow for greater spacing between pads 22 without an overall increase in pad footprint (across all pads on a tile 10. As shown in FIG. 6B, the interconnects 25 and a portion of the contact pads 22, 24 may be passivated/insulated with an insulating material 37. The insulating material 37 may include, for example, a liquid silicone that is flow-coated over the interconnects 25 and then cured to form a solid passivation.

It will be understood that greater spacing between tiles 10 may be beneficial when adjacent pads on the tiles 10 are intended to carry large differentials in potential, in which case greater separation enabled by small interconnects 25 and pads 22 may allow for greater isolation and/or insulation and/or may help to prevent the formation of unintended current paths (e.g., shorts or partial shorts) between pads, that might otherwise occur due to humidity, ionic salt exposures, moisture, solvent accumulations, the invasion of biological matter onto the surface between pads, and the like.

With such greater spacing and for increased electrical isolation between adjacent pads 22 on a tile 10, slots may be employed, greatly increasing the effective path length for would-be short and thus increasing the effective dielectric strength between pads 22. Also, the relatively small wire sizes of "large wire" A1 wire bond interconnects can, when coupled with the very high bonding speeds of automated wedgebonders, allow for two or more bonds to be placed in a redundant fashion, as shown in FIG. 6C, where there would otherwise be only one interconnect. This may increase reliability and/or durability of the distributed light source built from tiles without substantially increasing the overall cost.

As discussed above, the loop height for the interconnects 25 can also be quite low, reaching no more than 0.020" in some cases, or 0.015" or 0.12" in other cases, above the plane of the tiles 10 upon which the LEDs are mounted (and/or upon which the interconnect pads 22 are formed and interconnects 25 are bonded). By adjusting the loop height of the interconnects 25, one may adjust their ability to accommodate expansion and contraction between tiles 10 and flexure at the gaps between tiles 10. As long as the loop height h is less than the spacing between adjacent, independent, interconnects 25 (e.g. distance d in FIG. 6C). In particular, the height h of the loop interconnects 25 may be less than about one half the spacing between adjacent independent interconnects 25. Accordingly, a system according to some embodiments of the invention may be capable of tolerating substantial strain/deflection/deformation without adjacent wire interconnects 25 making undesirable contact between one another. As noted above, redundant (double, triple or even quadruple) bonds may be made on one set of contact pads. It will be appreciated that contact among parallel redundant wires would not be problematic.

Large wire interconnection of adjacent tiles 10 as described above may not require lead or other hazardous materials (such as in some solder-based systems) and also may not generally require reactive fluxes (which can become agents of damage on the tiles if present and not removed).

In other embodiments, tile interconnection may be accomplished by means of gold ribbon wire bonding. Many advantages similar to those of LWI interconnection can be delivered through the use gold ribbon wire bonding. For example, gold ribbon wire bonding may be low-cost, high reliability, flexure-accommodating, expansion/contraction resilient, environmentally sensitive, highly automatable and/or optionally redundant. The gold ribbon wire may be 1 to 3 mils (0.001" to 0.003") in height and from 0.005" to 0.015" in width, giving a rectangular section. However, some heat may need to be applied in order to bond the ribbon to the substrate. Gold ribbon may be somewhat more expensive, but may be more robust in certain caustic environments and may in some cases offer a lower loop height and/or may allow for closer pad spacing due to the lack of propensity for the rectangular cross-section wire to "sweep" or sway in a direction transverse to the progression of the interconnect axis.

Those skilled in the art may realize that some of the same benefits and others may be garnered by substitution of different wire compositions including elements or alloys, or any number of different sizes or section shapes, or different bond pads (in terms of composition, shape, size, etc.) without departing from the scope of the present invention.

Referring to FIG. 6B, adjacent tiles 10 may be electrically isolated from one another by optional insulating spacers 32 positioned between them. The spacers 32 may include an elastomeric material which may accommodate flexure of the backlight assembly 10, while also accommodating thermal expansion/contraction cycles. The spacers 32 may be formed using a liquid dispensed sealant, such as Dow Corning 738 liquid silicone electrical sealant. When the spacers 32 include a liquid sealant, the sealant may be dispensed before or after formation of the loop interconnects 25. The liquid sealant may be cured after dispensing, for example by heating the liquid sealant for a sufficient period of time. In some embodiments, the sealant may provide protection for the loop interconnects 25 as well as providing electrical isolation and/or mechanical protection for the tiles 10.

In other embodiments, the spacers 32 may include pre-formed members, such as PVC members, that may be press-fit or otherwise provided between adjacent tiles 10, 10'. The pre-formed members may include protrusions 33 that may help keep the spacers 32 in place. In addition, bottom corners of the tiles 10, 10' may be chamfered to form a recess 23 configured to mate with the protrusions 33.

The spacers 32 may include a high-K dielectric material to reduce and/or prevent electrical shorts between the electrical traces on the tiles 10 and the metal of the MCPCB material of the tiles 10.

Figure 7:
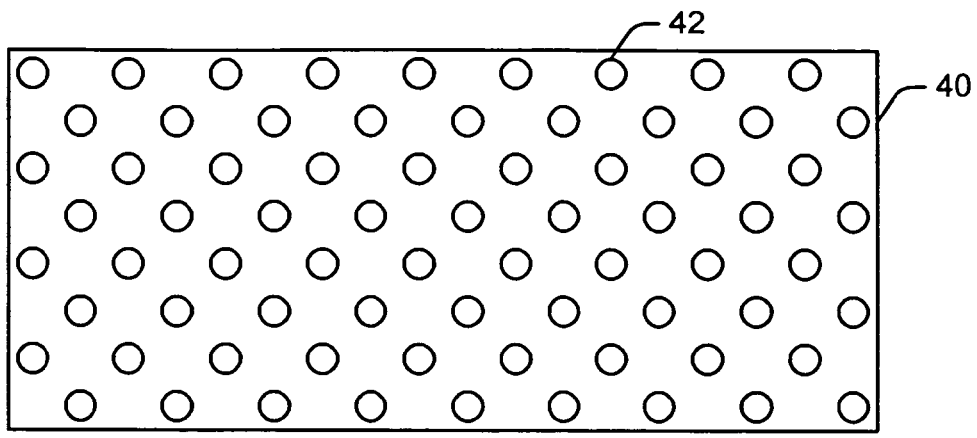
FIG. 7 is a plan view illustration of a reflector panel for use in a lighting panel according to some embodiments of the invention.

Referring to FIG. 7, in order to provide and/or improve light recycling an LCD display, a reflector panel 40 may be provided in a lighting panel. The reflector panel 40 may have a length and width similar to the length and width of the two-dimensional array. The reflector panel 40 may include a plurality of apertures 42 therein, which apertures 42 may align with the clusters 12 on the two dimensional backlight array 36. The reflector panel 40 may include a lightweight reflective material. In some embodiments, the reflector panel 40 may include a white plastic foam material such as microcellular polyethylene-terephthalate (MCPET) plastic that has been processed into a lightweight white foam. Suitable MCPET material is available from Furukawa Electric Co. of Tokyo, Japan. Accordingly, in addition to reflecting incident light, the reflector panel 40 may help disperse the incident light so that it is reflected in a random direction, which may improve the uniformity of an LCD display.

Figure 9:
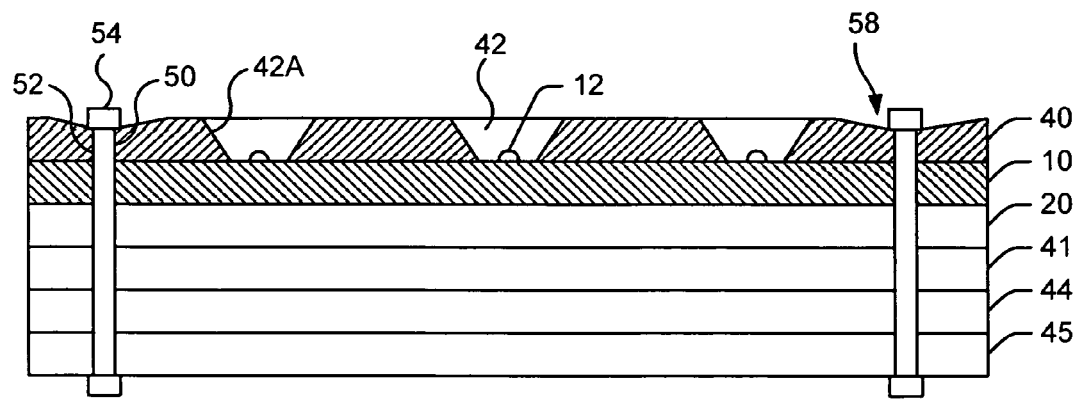
FIG. 9 is a cross sectional illustration of a lighting unit according to some embodiments of the invention.
Figure 10:
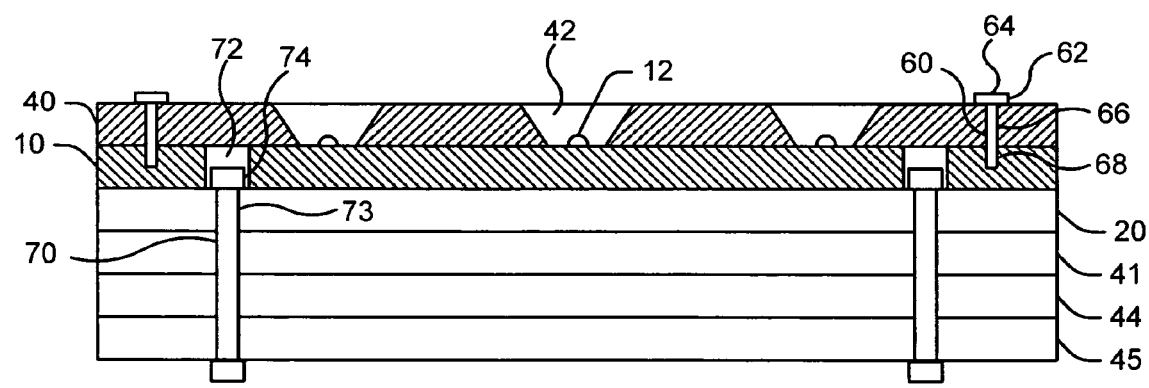
FIG. 10 is a cross sectional illustration of a lighting unit according to further embodiments of the invention.

The apertures 42 may be circular apertures, and may have a sidewall 42A that is angled with respect to the surface of the tiles 10, thereby forming optical cavities around the clusters 12, as shown in FIGS. 9 and 10.

Figure 8:
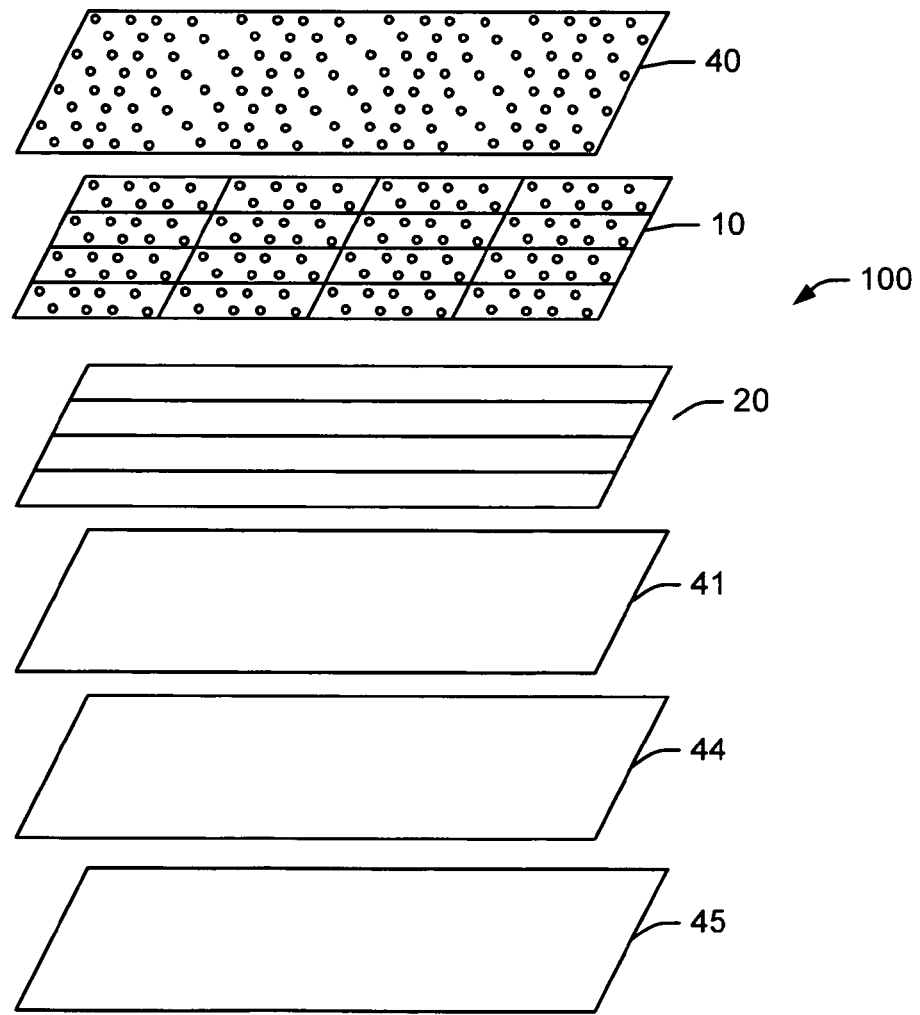
FIG. 8 is an exploded perspective view of a lighting unit according to some embodiments of the invention.

A lighting panel assembly 100 is shown in exploded perspective view in FIG. 8. As shown therein, a lighting panel assembly 100 may include a plurality of tiles 10 having clusters 12 thereon arranged in a two dimensional array. The tiles 10 are mounted on corresponding bar support members 20, which may be mounted for support on a panel support member (cover bottom) 44, which may include a metal plate. It will be appreciated that, in some embodiments, the tiles 10 may be mounted directly on the cover bottom 44. A reflector panel 40 including a plurality of apertures 42 therethrough is mounted above the tiles 10 such that the apertures 42 may align with respective clusters 12 on the tiles 10.

An optional first thermal spacer, such as a graphite thermal spacer 41, may be provided between the cover bottom 44 and the bar support members 20. The first thermal spacer 41 may include, for example, an anisotropic carbon spreader such as the Spreadershield available from Graphtec International, Ltd., of Cleveland, Ohio. The thermal spacer 41 may be configured to conduct heat generated by the bar support members 20 to the cover bottom 40 and to spread the conducted heat over the area of the thermal spreader. Accordingly, the first thermal spacer 41 may help disperse residual thermal nonuniformities in the system. The first thermal spacer 41 may be held in place by compression force between the cover bottom 44 and the bar support members 20. Alternatively or additionally, the first thermal spacer 41 may be pre-installed in the cover bottom 44 held in place using, for example, a two-sided pressure sensitive adhesive tape until final assembly.

A second optional thermal spacer 45 may be provided on an outside surface of the cover bottom 44 (i.e. on a side of the cover bottom 44 opposite the bar support member 20). The second optional thermal spacer 45 may act as a shield to shield the tiles 10 from thermal nonuniformities, such as heat sources and/or heat sinks, outside the display. For example, electronic drive circuitry, heatsinks, and/or other elements near the back of the display may generate excess heat and/or act as heatsinks. Such thermal nonuniformities may cause LED chips 16 on the tiles 10 to have different operating temperatures, which may affect the color balance of the display, since the dominant wavelength of an LED may be affected by operating temperature. Providing a thermal spacer 45 on the outside of the cover bottom 44 may help keep the LED chips 16 on the tiles 10 at a consistent operating temperature.

As discussed above, the tiles 10 may be affixed to respective bar support members 20 by means of an adhesive. The entire assembly, however, may be fastened together by means of fasteners 50, as shown in FIG. 9. Referring to FIG. 9, a fastener 50 may include at least a fastener body 52 which may extend through the reflector panel 40, a tile 10, a bar support member 20, and the first optional thermal spacer 41, then into the cover bottom 44 and the second optional thermal spacer 45. In some embodiments, the fastener 50 may engage the cover bottom 44 directly, and the second optional thermal spacer 45 may be held in place on the cover bottom 44 by other fasteners and/or an adhesive. The fastener 50 may include a head 54, which is configured to engage and hold the reflector panel 40 onto the underlying tile 40.

However, since the fasteners 50 may provide mechanical connection of the bar support member 20 to the cover bottom 44, the fasteners 50 may grip the reflector panel 40 tightly enough that the reflector panel 40 may be slightly deformed in or near the regions where the fasteners 50 are attached, as indicated by the arrow 58. Such deformation of the reflector panel 40 may be undesirable, since it may cause the reflector panel 40 to reflect light in an uneven manner near the fasteners 50, and may result, for example, in localized nonuniformities in the brightness of the lighting panel 100.

According to some embodiments of the invention, a solid state lighting panel 100 may be assembled as illustrated in FIG. 10. As shown in FIG. 10, the reflector panel 40 may be attached to the tiles 10 using a plurality of pins 60. A pin 60 may include a body 62 and a head 64. The body 62 of the pin may extend through a hole 66 in the reflector panel 40 and into a corresponding hole 68 in a tile 10. The pin 60 may be press-fit into the holes 66, 68. In addition, the pins 60 and/or the holes 68 may include features, such as protrusions, notches, etc., that may help to hold the pins 60 in place in the holes 68.

Since the reflector panel 40 may have a substantially different coefficient of thermal expansion (CTE) compared to the tiles 10, it may be desirable to provide at least one pin 60 for each tile 10 (and in some embodiments at least two pins 60 for each tile 10), which may maintain the reflector panel in better registration with the underlying tiles 10. This may help reduce and/or prevent buckling of the reflector panel 40 that may otherwise when the LCD display 100 is operating.

In some embodiments, the pin 60 may be formed of a white colored material, such as nylon and/or the same or similar material as the reflector panel 40, for example, PET plastic. In that way, the pin 60 may provide the same or similar reflectance as the reflector panel 40, thereby providing a more uniform light output from the backlight assembly 10. Moreover, since the function of the pins 60 may be only to hold the lightweight reflector panel 40 in place on the tiles 10, the pins 60 may grip the reflector panel 40 relatively lightly, and may not significantly deform the surface of the reflector panel 40, thereby potentially improving the uniformity of the backlight assembly 10.

The head 64 of the pin 60 may have a low profile, such that the head 64 may be positioned nearly flush with the reflector panel 40 when the pin 60 is in place. Accordingly, the pin 60 may act as a functional extension of the reflector panel 40. Furthermore, the head 64 of the pin 60 may be made low so as not to substantially shadow light emitted from a cluster 12 on a tile 10.

As further illustrated in FIG. 10, a tile 10 may have a hole or notch 72 therethrough that may be aligned with a corresponding hole 73 in the bar support member 20. A fastener 70 may extend through the hole 73 in the bar support member 20 and the optional thermal spacer 41 and into the cover bottom 44. In some embodiments, the fastener 70 may extend completely through the cover bottom 44. The fastener 70 may include a head 74 that engages the bar support member 20 and holds the bar support member 20 in place against the thermal spacer 41 and/or the cover bottom 44. The head 74 may be positioned at least partially within the hole 72 in the tile 10. The head 74 may have a diameter that is smaller than a diameter of the hole 72, such that the fastener 70 may not engage the tile 10, mechanically or electrically. Likewise, the head 74 may have a diameter that is larger than a diameter of the hole 73 in the bar support member 20, so that the head 74 may engage the bar support member 20. The head 74 of the fastener 70 may have a height that is less than the thickness of the tile 10, such that the head 74 may not protrude above the upper surface of the tile 10 when the fastener 70 is in place. In this way, the fastener 70 may not deform or otherwise interfere with the reflector panel 40.

Since the fastener 70 may not directly contact the tile 10, a potential route for electrostatic discharge (ESD) may be avoided, thereby potentially improving the operational reliability of the backlight assembly 10.

Moreover, since the fastener 70 may not have to hold the reflector panel 40 and/or tiles 10 in place, the fastener 70 may be shorter in length, which may reduce the overall weight of the system.

Figure 11:
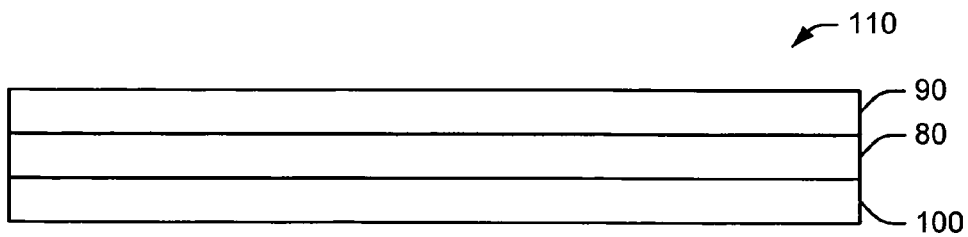
FIG. 11 is a cross sectional illustration of an LCD display panel including a backlight unit according to some embodiments of the invention.

FIG. 11 is a cross sectional illustration of an LCD display panel assembly 110 including a lighting panel 100 used as a backlight unit, a disperser 80 and an LCD screen 90. An LCD display panel assembly 110 may include other elements, such as brightness enhancing films (not shown). Light generated by the backlight unit 100 travels through the disperser 80 and illuminates the LCD screen 90. The LCD screen 90 includes appropriately arranged shutters and associated filters that are configured to selectively pass/block a selected color of light from the backlight unit 100 to generate a display image.

The backlight unit 100 may include a solid state backlight unit, such as an LED-based backlight unit as described above including a plurality of solid state light sources arranged in a two-dimensional array in the backlight unit 100. LED-based solid state backlight units for LCD screens are described, for example, in U.S. patent application Ser. No. 10/034,240, filed Jan. 12, 2005 and entitled "Solid Colloidal Dispersions For Backlighting Of Liquid Crystal Displays", and U.S. patent application Ser. No. 10/022,332, filed Dec. 23, 2004 and entitled "Light Emitting Diode Arrays For Direct Backlighting Of Liquid Crystal Displays", which are assigned to the assignee of the present invention and the disclosures of which are incorporated herein by reference as if fully set forth herein.

The disperser 80 may help to spread and/or disperse light generated by the backlight unit 100, so that light striking the LCD screen 90 may be distributed more evenly across the surface of the LCD screen 90. Dispersers for LED screens are known in the art, and may be formed from materials such as acrylates.

Some light generated by the backlight unit 100 may be internally reflected one or more times through the disperser 80 before it exits the LCD screen 90 through an open LCD shutter (not shown) in the LCD screen 90. Such reflection of light, which may be referred to as light recycling, may help to increase the uniformity of the display, since light rays from the light sources in the backlight unit 10 may become more randomly distributed as they are repeatedly reflected. In addition, such light recycling may also help to increase the brightness and/or efficiency of the display, as light that may otherwise be lost due to absorption may be advantageously reflected back through the disperser 80 until it can be extracted through an open LCD shutter.

Systems and methods for controlling solid state backlight panels are described, for example, in U.S. patent application Ser. No. 11/368,976, entitled "Adaptive Adjustment of Light Output of Solid State Lighting Panels", filed Mar. 6, 2006, which is assigned to the assignee of the present invention and the disclosure of which is incorporated herein by reference in its entirety.

Figure 12:
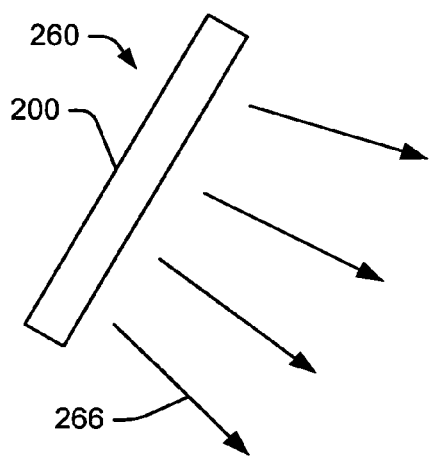
FIG. 12 is a schematic cross sectional illustration of a lighting panel for general illumination according to some embodiments of the invention.

Referring to FIG. 12, a lighting panel 200 including a plurality of tiles 10 according to some embodiments of the invention may be used as a lighting panel for a solid state lighting fixture or luminaire 260. Light 266 emitted by the luminaire 260 may be used to illuminate an area and/or an object. Solid state luminaires are described, for example, in U.S. patent application Ser. No. 11/408,648, entitled "Solid State Luminaires for General Illumination", filed Apr. 21, 2006, which is assigned to the assignee of the present invention and the disclosure of which is incorporated herein by reference in its entirety.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A solid state lighting unit, comprising:
 a plurality of solid state lighting tiles, each of the solid state lighting tiles comprising a planar surface and a plurality of solid state light sources on the planar surface; and
 a plurality of bar support members, wherein respective ones of the bar support members include at least two of the plurality of tiles affixed thereon to form respective bar assemblies;
 wherein respective ones of the solid state light sources on the solid state lighting tiles of a bar assembly are electrically connected in series so as to be simultaneously energized upon application of a voltage thereto.

2. The solid state lighting unit of claim 1, further comprising:
 a panel support member, wherein the plurality of bar assemblies are affixed to the panel support member on a side of the bar support members of the bar assemblies opposite the solid state lighting tiles.

3. The solid state lighting unit of claim 2, wherein the panel support member comprises a cover bottom affixed to the plurality of bar assemblies opposite the plurality of solid state lighting tiles.

4. The solid state lighting unit of claim 3, further comprising a thermal spreader on the cover bottom.

5. The solid state lighting unit of claim 4, wherein the thermal spreader comprises a sheet of thermally conductive material having an area and configured to conduct heat generated by the solid state lighting devices to the cover bottom and to reduce thermal nonuniformities in the solid state lighting unit by spreading the conducted heat over the area of the thermal spreader.

6. The solid state lighting unit of claim 4, wherein the thermal spreader is between the cover bottom and the plurality of bar assemblies.

7. The solid state lighting unit of claim 4, wherein the cover bottom is between the thermal spreader and the plurality of bar assemblies.

8. The solid state lighting unit of claim 4, wherein the thermal spreader comprises a first thermal spreader between the cover bottom and the plurality of bar assemblies, the solid state lighting unit further comprising a second thermal spreader, wherein the cover bottom is between the first thermal spreader and the second thermal spreader.

9. The solid state lighting unit of claim 1, wherein each of the plurality of bar assemblies comprises a thermally conductive elongate member, and wherein the plurality of bar assemblies are arranged side by side in the solid state lighting unit.

10. The solid state lighting unit of claim 1, wherein each of the plurality of bar assemblies further comprises a loopback connector at an end of the bar assembly.

11. The solid state lighting unit of claim 1, further comprising a plurality of spacers between adjacent ones of the solid state lighting tiles on a respective bar assembly.

12. The solid state lighting unit of claim 11, wherein each of the plurality of spacers comprises a nonconductive elastomeric material.

13. The solid state lighting unit of claim 12, wherein each of the plurality of spacers comprises a protrusion configured to mate with a corresponding recess in at least one of the adjacent solid state lighting tiles.

14. The solid state lighting unit of claim 11, wherein respective ones of the tiles comprise electrical pads on the planar surface thereof, the solid state lighting unit further comprising:
a wire loop extending between electrical pads on adjacent tiles to electrically interconnect the electrical pads of adjacent tiles across a spacer between the tiles.

15. The solid state lighting unit of claim 14, wherein the height of the wire loop from the planar surface is between about 0.02 and about 0.12 inches.

16. The solid state lighting unit of claim 11, further comprising an insulating material on the wire loop.

17. The solid state lighting unit of claim 11, wherein the electrical pads are in electrical communication with one or more of LED chips through circuit traces on the tile such that when sufficient voltage is applied across the electrical pads, current flows through the light sources and the light sources emit useful light.

18. The solid state lighting unit of claim 1, further comprising a reflector panel on the plurality of lighting tiles.

19. The solid state lighting unit of claim 18, wherein the reflector panel comprises a diffuse light reflector.

20. The solid state lighting unit of claim 18, wherein the reflector panel comprises a plurality of circular apertures therein that are aligned with respective ones of the plurality of solid state lighting elements, and wherein the solid state lighting elements are at least partially disposed within the respective apertures.

21. The solid state lighting unit of claim 20, wherein the apertures circular apertures having sidewalls that form an angle with the planar surface of the tiles.

22. The solid state lighting unit of claim 18, further comprising a plurality of pins comprising a body and a head, wherein reflector panel is attached to the tiles using the pins, wherein the pins extend through a hole in the reflector panel and into a corresponding hole in a tile.

23. The solid state lighting unit of claim 22, wherein the pins comprise a diffuse light reflective material.

24. The solid state lighting unit of claim 22, wherein the pins extend into the tiles but not into the bar support members.

25. The solid state lighting unit of claim 2, further comprising a fastener extending between at least one of the bar support members and the panel support member, wherein the fastener has a head on a side of the bar support member opposite the panel support member, and wherein the head is at least partially disposed within an aperture in a tile and has a height less than a height of the tile.

26. The solid state lighting unit of claim 25, wherein the head is spaced apart from the tile such that it is not in contact with the tile.

27. The solid state lighting unit of claim 25, further comprising a reflector panel on the plurality of lighting tiles.

28. The solid state lighting unit of claim 27, further comprising a plurality of pins comprising a body and a head, wherein reflector panel is attached to the tiles using the pins, wherein the pins extend through a hole in the reflector panel and into a corresponding hole in a tile.

29. The solid state lighting unit of claim 28, wherein the pins extend into the tiles but not into the bar support members.

30. A solid state lighting unit, comprising:
a panel support member;
a plurality of solid state lighting tiles, each of the solid state lighting tiles comprising a planar surface and a plurality of solid state light sources on the planar surface; and
a plurality of bar support members, wherein respective ones of the bar support members include at least two of the plurality of tiles affixed thereon to form respective bar assemblies;
wherein the bar assemblies are mounted on the panel support member such that the bar support members are between the panel support member and the tiles.

31. The solid state lighting unit of claim 30, further comprising a thermal spreader between the panel support member and the plurality of bar assemblies, wherein the thermal spreader comprises a sheet of thermally conductive material having an area and configured to conduct heat generated by the solid state lighting devices to the panel support member and to reduce thermal nonuniformities in the solid state lighting unit by spreading the conducted heat over the area of the thermal spreader.

32. The solid state lighting unit of claim 31, further comprising a reflector panel on the plurality of lighting tiles.

33. The solid state lighting unit of claim 32, further comprising a plurality of pins comprising a body and a head, wherein reflector panel is attached to the tiles using the pins, wherein the pins extend through a hole in the reflector panel and into a corresponding hole in a tile.

34. The solid state lighting unit of claim 33, wherein the pins extend into the tiles but not into the bar support members.

35. The solid state lighting unit of claim 32, further comprising a fastener extending between at least one of the bar support members and the panel support member, wherein the fastener has a head on a side of the bar support member opposite the panel support member, and wherein the head is at least partially disposed within an aperture in a tile and has a height less than a height of the tile.

36. The solid state lighting unit of claim 35, wherein the head is spaced apart from the tile such that it is not in contact with the tile.

37. A solid state lighting unit comprising:
at least one bar support member;
first and second solid state lighting tiles on the bar support member;
a nonconductive elastomeric spacer between the first and second solid state lighting tiles.

38. A solid state lighting tile, comprising:
a substrate having a planar surface, a first end, a second end opposite the first end, and a longitudinal center axis extending between the first end and the second end;
a plurality of first strings of series-connected LEDs on the surface of the substrate, the first strings having respective anode contacts at the first end of the tile and cathode contacts at the second end of the tile; and
a plurality of second strings of series-connected LEDs, the second strings having respective anode contacts at the second end of the tile and cathode contacts at the first end of the tile, wherein:
each of the plurality of first strings and the plurality of second strings includes at least a first color string of LEDs configured to emit light having a first wavelength when energized, and a second color string of LEDs configured to emit light having a second wavelength when energized;
the first plurality of strings and the second plurality of strings run generally parallel to the longitudinal center axis; and
the anode and cathode contacts of the first color string of the first plurality of strings and the anode and cathode contacts of the first color string of the second plurality of strings are disposed nearer to the longitudinal center axis of the tile than the anode and cathode contacts of the second color string of the first plurality of strings and the anode and cathode contacts of second color string of the second plurality of strings.

39. The solid state lighting unit of claim 37, wherein the spacer comprises a protrusion configured to mate with a corresponding recess in at least one of the first or second solid state lighting tiles.

40. The solid state lighting unit of claim 37, further comprising:
electrical pads on surfaces of the first and second tiles opposite the bar support member; and
a wire loop extending between the electrical pads to electrically interconnect the electrical pads across the spacer.

41. The solid state lighting unit of claim 40, wherein the height of the wire loop from the planar surface is between about 0.02 and about 0.12 inches.

42. The solid state lighting unit of claim 40, further comprising:
a plurality of parallel wire loops extending between the electrical pads to provide a redundant electrical interconnection between the electrical pads.

43. The solid state lighting unit of claim 37, further comprising:
first and second adjacent electrical contacts on a surface of the first lighting tile opposite the bar support member;
third and fourth adjacent electrical contacts on a surface of the second lighting tile opposite the bar support member;
a first wire loop extending between the first electrical pad of the first lighting tile and the third electrical pad of the second lighting tile to electrically interconnect the first and third electrical pads across the spacer;
a second wire loop extending between the second electrical pad of the first lighting tile and the fourth electrical pad of the second lighting tile to electrically interconnect the second and fourth electrical pads across the spacer;
wherein the first and second wire loops are spaced apart by a distance d that is at least about equal to a height h of the first and second wire loops from the surfaces of the first and second lighting tiles.

44. The solid state lighting unit of claim 43, wherein the height h of the first and second wire loops is less than about half of the distance d between the first and second wire loops.

45. A solid state lighting tile, comprising:
a substrate having a planar surface;
a plurality of first strings of series-connected LEDs on the substrate, the first strings having respective anode contacts at a first end of the tile and cathode contacts at a second end of the tile opposite the first end; and
a plurality of second strings of series-connected LEDs, the second strings having respective anode contacts at the second end of the tile and cathode contacts at the first end of the tile;
wherein each of the plurality of first strings and the plurality of second strings includes at least a first color string of LEDs configured to emit light having a first wavelength when energized and a second color string of LEDs configured to emit light having a second wavelength when energized; and
wherein the cathode contact of the first color string of the first plurality of strings and the anode contact of the first color string of the second plurality of strings are offset in a direction parallel to the longitudinal center axis of the tile from the cathode contact of the second color string of the first plurality of strings and the anode contact of the second color string of the second plurality of strings.

46. The solid state lighting tile of claim 45, wherein the cathode contact of the first color string of the first plurality of strings and the anode contact of the first color string of the second plurality of strings are farther from the second end of the tile than the cathode contact of the second color string of the first plurality of strings and the anode contact of the second color string of the second plurality of strings.

47. A method of forming a solid state lighting bar assembly including a bar support member comprising a plurality of registration holes and a plurality of solid state lighting tiles comprising at least one registration hole each, the method comprising:
placing the bar support member on a jig including at least one alignment pin aligned with one of the registration holes in the bar support member so that the alignment pin extends through the registration hole; and
placing one of the plurality of tiles on the bar support member such that the alignment pin extends through the registration hole in the tile; and
affixing the tile to the bar support member.

48. The method of claim 47, wherein affixing the tile to the bar support member comprises dispensing an adhesive on the bar support member before placing the tile on the bar support member.

49. The method of claim 47, wherein the tile comprises a first tile including a contact pad adjacent an end thereof and wherein the jig includes a second alignment pin, the method further comprising:
placing a second tile including a contact pad adjacent an end thereof on the jig such that the second alignment pin extends through the registration hole in the second tile and such that the end of the second tile is adjacent the end of the first tile; and
electrically connecting the contact pad of the first tile and the contact pad of the second tile.

50. The method of claim 49, wherein electrically connecting the contact pad of the first tile and the contact pad of the second tile comprises forming a loop connection between the contact pad of the first tile and the contact pad of the second tile.

51. The method of claim 50, further comprising:
forming an insulating material on the loop connection.

52. The method of claim 50, wherein the height of the loop connection is between about 0.02 and about 0.12 inches.

53. The method of claim 50, wherein forming a loop connection between the contact pad of the first tile and the contact pad of the second tile comprises forming a plurality of parallel loop connections between the contact pad of the first tile and the contact pad of the second tile.

54. The method of claim 50, wherein the first tile comprises first and second contact pads and wherein the second tile comprises first and second contact pads, the method further comprising:
forming a first loop connection between the first contact pad of the first tile and the first contact pad of the second tile and forming a second loop connection between the second contact pad of the first tile and the second contact pad of the second tile, wherein the first and second loop connections are spaced apart by a distance d that is at least about equal to a height h of the first and second loop connections.

55. The method of claim 54, wherein the height h of the first and second loop connections is less than about half of the distance d between the first and second loop connections.

56. The method of claim 49, wherein electrically connecting the contact pad of the first tile and the contact pad of the second tile comprises providing a wire ribbon connection between the first tile and the second tile.

57. The method of claim 49, further comprising:
   providing an insulating spacer between the first tile and the second tile.

58. The method of claim 57, wherein providing an insulating spacer between the first tile and the second tile comprises dispensing a liquid sealant in a seam between the first tile and the second tile and curing the dispensed liquid sealant.

59. The method of claim 57, wherein providing an insulating spacer between the first tile and the second tile comprises pressing a pre-formed insulating member in a seam between the first tile and the second tile.

60. The method of claim 59, wherein the preformed insulating member comprises a protrusion configured to mate with a corresponding recess in an edge of the first or second tile.

* * * * *